United States Patent [19]

Rogers et al.

[11] Patent Number: 4,807,006

[45] Date of Patent: Feb. 21, 1989

[54] HETEROJUNCTION INTERDIGITATED SCHOTTKY BARRIER PHOTODETECTOR

[75] Inventors: Dennis L. Rogers, Croton-On-Hudson; Jerry M. Woodall, Bedford Hills; George D. Pettit, Mahopac; David T. McInturff, Croton-On-Hudson, all of N.Y.

[73] Assignee: International Business Machines Corporation, Armonk, N.Y.

[21] Appl. No.: 64,186

[22] Filed: Jun. 19, 1987

[51] Int. Cl.$^4$ .............................................. H01L 27/14
[52] U.S. Cl. ........................................ 357/30; 357/15; 357/16
[58] Field of Search .......... 357/15, 30 C, 30 E, 30 B, 357/16, 30 Q (U.S. only)

[56] References Cited

U.S. PATENT DOCUMENTS

| | | | |
|---|---|---|---|
| 3,700,980 | 10/1972 | Belasso et al. | 317/235 R |
| 3,868,523 | 2/1975 | Klopfer et al. | 357/30 E X |
| 3,995,303 | 1/1976 | Nahory et al. | 357/30 E |
| 4,068,252 | 1/1978 | Lebailly | 357/16 X |
| 4,195,305 | 3/1980 | Moon | 357/30 E X |
| 4,478,879 | 10/1984 | Baraona et al. | 427/85 |
| 4,593,304 | 6/1986 | Slayman et al. | 357/30 E |

FOREIGN PATENT DOCUMENTS 0063421 10/1982 European Pat. Off. .

OTHER PUBLICATIONS

Yang et al, "Heterojunction Schottky Barrier Solar Cell", *Conference: Fourteenth IEEE Photovoltaic Specialists Conference 1980,* San Diego, Calif., USA (Jan. 7–10 1980), pp. 1333–1337.
Fritz et al, "Critical Layer Thickness in $In_{0.2}Ga_{0.8}$As/GaAs Single Strained Quantum Well Structures," *Appl. Phys. Lett.,* vol. 51, No. 13, Sep. 1987, pp. 1004–1006.
Roth et al., "The DSI-Diode-A Fast Large Area Optoelectronic Detector," *IEEE Trans. on Electron Devices,* vol. Ed-32, No. 6 (1985), pp. 1034–1037.
Sakai, "New Method to Relax Thermal Stress in GaAs Grown on Si Substrates", *Appl. Phys. Lett:* 51(14), Oct. 5, 1987, pp. 1069–1071.
Bringans et al, "Formation of the Interface between GaAs and Si: Implications for GaAs-on-Si Heteroepitaxy," *Appl. Phys. Lett.* 51(7), Aug. 17, 1987, pp. 523–525.

(List continued on next page.)

*Primary Examiner*—Andrew J. James
*Assistant Examiner*—William A. Mintel
*Attorney, Agent, or Firm*—Perman & Green

[57] ABSTRACT

A semiconductor photodetector is formed of interdigitated, metal-semiconductor-metal electrodes disposed on a surface of semi-insulating semiconductor material, gallium arsenide. Radiation such as infra-red or visible light is converted to an electric current flowing between the electrodes upon application of a bias voltage between the electrodes. A Schottky barrier at the junction of each electrode surface and the semiconductor surface limits current flow to that produced by photons. Tunneling of charge carriers of the current under the Schottky barrier, which tunneling results from the entrapment of charge carriers on the semiconductor surface, is inhibited by the production of a heterojunction surface layer upon the foregoing surface between the electrodes to repulse the charge carriers and prevent their entrapment at the surface. The heterojunction layer may be doped to enhance the repulsion of charge carriers. The heterojunction surface layer is of sufficient thickness to prevent tunneling of photogenerated carriers to a noncontacted region of the surface of the heterojunction layer and to also permit efficient repulsion of charge carriers from the surface. Longer wavelength photodetectors may also be formed in this way by providing misfit dislocation regions between the interaction region, which may be GaInAs, and a GaAs substrate, thereby providing a pseudo-morphic interaction region which is graded back to a heterojunction layer at the surface.

45 Claims, 3 Drawing Sheets

OTHER PUBLICATIONS (See top sheet)

IEEE Electron Device Letters, vol. EDL-5, No. 12, Dec. 1984, pp. 531-532 Entitled Monolithic Integration of a Metal-Semiconductor-Metal Photodiode and a GaAs Preamplifier by M. Ito et al.

Japanese Journal of Applied Physics, vol. 19 (1980) Supplement 19-1, pp. 459-464 Entitled Metal-Semiconductor-Metal Photodetector for High-Speed Optoelectronic Circuits by T. Sugeta et al.

Applied Physics Letters vol. 46, No. 10, May 1985, pp. 981-983 Entitled AlGaAs/GaAs p-i-n Photodiode/-Preamplifier Monolithic Photo Receiver Integrated on a Semi-Insulating GaAS Substrate by O. Wada et al.

Electronic Letters, vol. 22, No. 3, pp. 147-148, Jan. 30, 1986, Monolithic GaAs Photoreceiver for High-Speed Signal Processing Applications, by W. S. Lee et al.

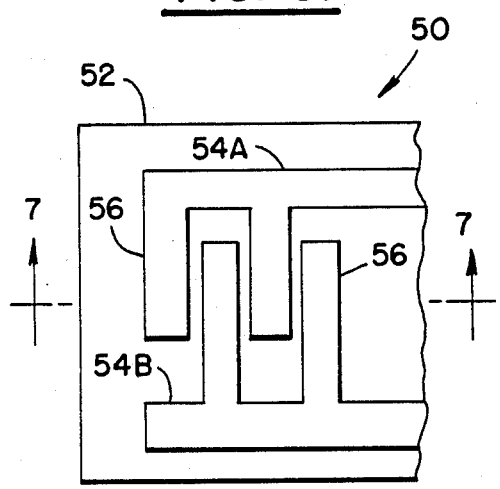
FIG. 6.
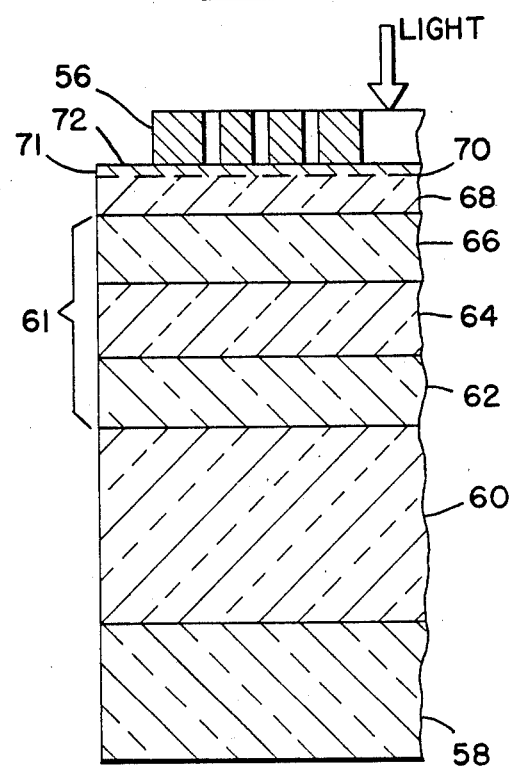
FIG. 7.
FIG. 8.
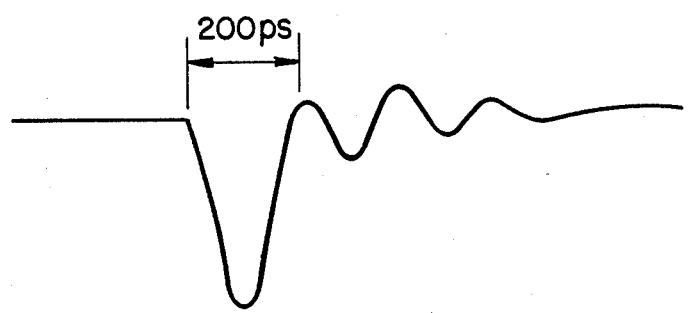
FIG. 9.
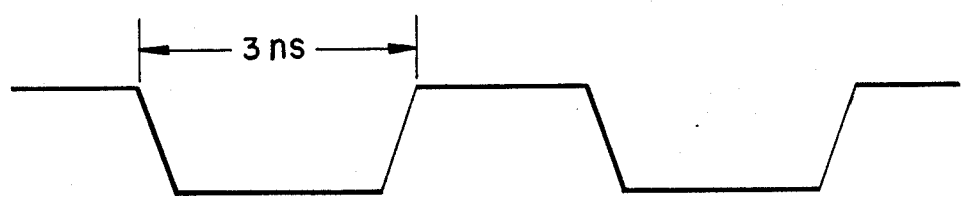

HETEROJUNCTION INTERDIGITATED SCHOTTKY BARRIER PHOTODETECTOR

BACKGROUND OF THE INVENTION

This invention relates to semiconductor photodetectors having Schottky barriers at the electrodes thereof and, more particularly, to an interdigitated photodetector having a non-lattice matched heterojunction surface layer with a band gap greater than that of an underlying light absorbing semiconductor, for inhibiting the entrapment of charge carriers on the semiconductor surface, thereby to prevent tunneling for improved signal quality.

A semiconductor photodetector is responsive to incident radiation by a process of converting photons to electron-hole pairs within a layer of semiconductor material thicker than the radiation penetration depth. The resulting electrons and holes are drawn off as electric current between a pair of electrodes located on one or more surfaces of the semiconductor layer. In one form of a semiconductor photodetector of interest, the electrodes are formed as an interdigitated electrode structure, and are biased by an external source of voltage to draw off the electrons and the holes. The electrodes may be constructed of metal joined to the semiconductor material by either ohmic contacts or Schottky barrier contacts.

Of particular interest herein is the photodetector structure employing the Schottky barrier contacts. The potential barrier of the Schottky construction is desirable for inhibiting the generation of electric current except by photon generated electron-hole pairs. This is useful in the transmission of digital signals optically by radiation such as infra-red and visible light, the optical signals being converted to electric signals by the photodetector. Such transmission may be accomplished by pulses of radiation. The Schottky construction is advantageous in that the foregoing action of the potential barrier inhibits the appearance of noise currents which would increase noise and distort the digital signals.

A problem arises in the foregoing structure wherein elements of the electrodes extend in a parallel array across the surface of the semiconductor material. At the edges of the electrodes, intense potential gradients are present which can cause tunneling. The electron and the hole currents induced by the radiation can be entrapped at the surface of the semiconductor material. The entrapped charge carriers alter the profile of the potential fields at the sites of the Schottky barriers to increase the potential gradient even more, narrowing the potential barriers into the semiconductor surface. In accordance with quantum mechanics, the tunneling of charges through the barriers increases, an effect of the tunneling being the appearance of noise currents and distortion in the reception of the foregoing digital signals. The noise currents may also be accompanied by an increase in the dark current of the photodetector, the dark current being a current which flows even in the absence of incident radiation. The tunneling, therefore, diminishes the advantage of using the Schottky construction in the photodetector.

One aspect of the entrapment of the charge carriers is the fact that the effect of the entrapped carriers, namely, the alteration of the potential field, changes slowly with time. For example, a pulsed infrared signal incident upon the detector would be converted by the altered potential field to an electrical pulse having a relatively sharp leading edge followed by a slow drift in amplitude. The drift is a result of the slow variation in the disturbance of the potential field by the entrapped charge carriers. This effect may be characterized as an undesirable low frequency gain which alters the waveform of an incoming pulse signal train causing intersymbol interference. A further effect is large dark currents and diminished responsivity of the photodetector and its external circuits to incoming radiation signals.

One still further problem arising from the use of prior interdigitated Schottky barrier radiation detectors, which employ gallium-arsenide (GaAs) as the photodetector, is that the detectors are limited to a useable longest wavelength of approximately 0.8 microns. The use of longer wavelength optical signals is desirable due to the lower dispersion of longer wavelength signals within radiation conveying optical fibers and also to evidence of higher inherent reliability of a longer wavelength radiation source, such as a laser. Typically, however, radiation absorbing semiconductor materials, such as InGaAs and InGaAsP, which have a sufficiently small band gap capable of detecting such longer wavelength radiation, are lattice mismatched to those accompanying semiconductor substrates which are currently useful for fabricating integrated circuits such as LSI GaAs MESFET circuits, thereby severely limiting their use. In addition to this lattice mismatch, these smaller band gap semiconductor materials also suffer from the aforedescribed surface state effects which result in a decreased photodetector signal-to-noise ratio.

It has been known to provide a doped region of photodetecting semiconductor material at the surface of a GaAs photodetector to reduce these surface state effects, as is disclosed in copending application Ser. No. 883,187, filed July 8, 1986. While beneficially inhibiting the entrapment of charge carriers, in some applications a small number of charge carriers which are created in the doped region may be attracted to the surface, resulting in the doped region having to be made thinner than may be desired.

SUMMARY OF THE INVENTION

The foregoing problems are overcome and other advantages are provided by a semiconductor photodetector comprising a layer of semiconducting material for converting radiation incident upon the photodetector into electric charge carriers within the layer. The invention is particularly applicable to semiconductor material formed of compounds of elements of the third and the fifth columns of the periodic table, known as III-V compounds, such as gallium arsenide and their alloys such as GaInAs. In one embodiment of the invention, the photodetecting layer is composed of semi-insulating gallium arsenide.

The photodetector further comprises a first electrode having an electrically conductive element extending upon a surface of the layer, and a second electrode having an electrically conductive element extending upon the surface of the layer alongside of the element of the first electrode and spaced apart therefrom. Each electrode may have a plurality of elements in which case the electrodes are arranged in an interdigitated format. Each of the electrode elements forms a Schottky barrier with the semiconductor layer for development of an electric current in the presence of the incident radiation and upon connection of a source of bias voltage between the first and the second electrodes.

In accordance with the invention, the entrapment of charge carriers at the surface of the semiconductor layer under the influence of the electric fields in the vicinity of each of the electrode elements is inhibited by the construction of a heterojunction semiconductor layer at the surface of the layer in which the conversion takes place between the photons and the electric charge carriers. The heterojunction layer has a wider band gap than that of the underlying substrate layer, resulting in the bending of the conduction and valence band gap lines and the generation of an electrical field which deflects electrons and holes away from the surface. The heterojunction layer deflects and repulses charge carriers, especially electrons, away from the surface, thereby reducing entrapment of charge carriers along the surface and inhibiting tunneling of charge carriers under a Schottky barrier. The heterojunction layer is of sufficient thickness to prevent tunneling of photogenerated carriers to the noncontacted region of the surface of the heterojunction layer and to also permit efficient repulsion of charge carriers from the surface. The heterojunction layer may further be doped with a suitable impurity, such as a p-type acceptor impurity, for additionally repelling holes away from the surface. The amount of doping may be adjusted to substantially equalize the amounts that the conduction and valence bands are bent due to the heterojunction, thereby equalizing the repulsion of both electrons and holes.

In accordance with another embodiment of a photodetector and a method of fabricating a photodetector of the invention, the entrapment of charge carriers at the surface of the semiconductor layer under the influence of the electric fields in the vicinity of each of the electrode elements is inhibited by the construction of a multilayer semiconductor device which comprises a buffer layer grown over a semi-insulating substrate, the growth of one or more abrupt heterojunction lattice accommodation semiconductor layers upon the buffer layer, each of the lattice accommodation layers having an unstrained lattice constant which is different from the substrate and which is also different from that of other lattice accommodation layers and also a differing mole percent concentration of a Type III-V compound therein, and the growth of a relatively thin radiation absorbing layer over the aforementioned lattice accommodation layers. The radiation absorbing layer is a strained layer which may be pseudo-morphic to the underlying and intervening lattice accommodation layers.

The layered structure of this embodiment is advantageous in that the radiation detecting semiconductor device may be comprised of non-lattice matched semiconductor material, such as GaInAs, responsive to longer wavelength optical signals than previous GaAs detectors. A heterojunction surface layer is provided by grading back the GaInAs to GaAs at the surface. Inasmuch as the lattice accommodation misfit dislocations, at the interfaces of the lattice accommodation layers, are buried beneath the photo-active GaInAs layer any adverse effects which may be introduced by the misfit dislocations are physically and electrically isolated from the photo-receptive pseudo-morphic layer.

BRIEF DESCRIPTION OF THE DRAWING

The foregoing aspects and other features of the invention are explained in the following description, taken in connection with the accompanying drawing wherein:

FIG. 6 is a plan view of a photodetector constructed in accordance with another embodiment of the invention, similar to the view of FIG. 1;

FIG. 7 is a sectional view of the photodetector of FIG. 6 taken along the line 7—7; and FIGS. 8 and 9 show representative waveforms which illustrate the operation of the photodetector of FIGS. 6 and 7.

DETAILED DESCRIPTION

Figure 1:
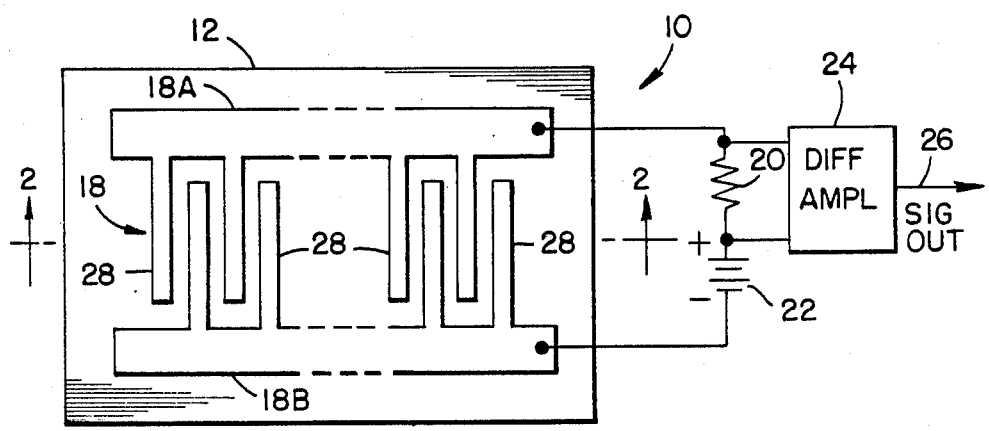
FIG. 1 is a plan view of a photodetector constructed in accordance with one embodiment of the invention, the view also showing connection of the photodetector with an external electric circuit.
Figure 2:
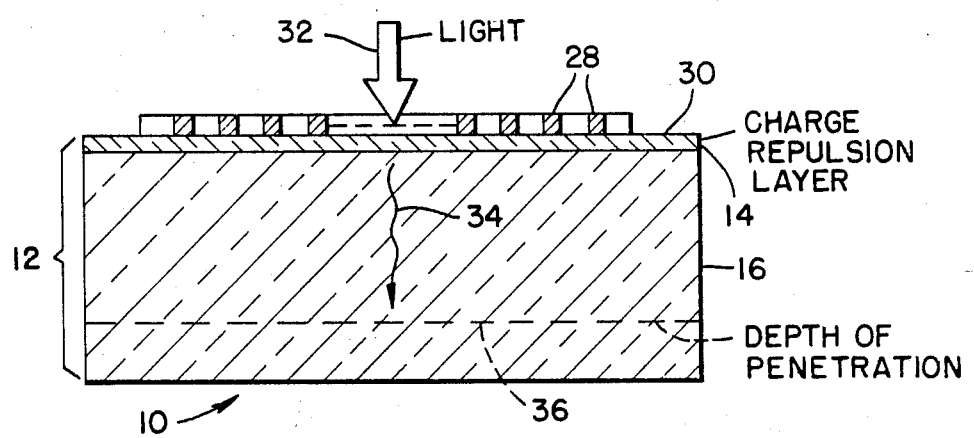
FIG. 2 is a sectional view of the photodetector of FIG. 1 taken along the line 2—2.

With reference to FIGS. 1 and 2, there is shown a photodetector 10 formed of a body 12 of semiconductor material, the body 12 being divided into two layers, namely, an upper layer 14 and a lower layer 16. A set of interdigitated electrodes 18 is disposed on top of the upper layer 14, the electrodes 18 including an anode electrode 18A connected via a resistor 20 to an anode terminal of a battery 22, and a cathode electrode 18B connected to a cathode terminal of the battery 22. The battery 22 serves as a source of voltage bias for operation of the photodetector 10, the resistor 20 providing a voltage drop proportional to detector current flowing through the photodetector 10. A differential amplifier 24 has a pair of input terminals connected to opposed terminal of the resistor 20 for providing an output signal on line 26 proportional to the detector current.

In the preferred embodiment of the invention, as depicted in FIG. 1, each of the electrodes 18 is provided with a set of elements 28 which extend transversely across a top surface 30 of the block 12. The elements 28 are parallel to each other and are spaced apart from each other to form the interdigitated structure. The electrodes 18 are In the preferred embodiment of the invention, as depicted in FIG. 1, each of the electrodes 18 is provided with a set of elements 28 which extend transversely across a top surface 30 of the block 12. The elements 28 are parallel to each other and are spaced apart from each other to form the interdigitated structure. The electrodes 18 are formed of a metal such as gold, aluminum or platinum, or of other electrically conducting material such as tungsten-silicide which can be made to form a Schottky contact with the semiconductor.

In the fabrication of the photodetector 10, the layer 16 is first prepared, the layer 16 comprising semi-insulating semiconductor material suitable for converting photons of radiation into electron-hole pairs. While, in a preferred embodiment of the invention, the layer 16 is composed of gallium arsenide, it is to be understood that the invention applies also to other semiconductor material, particularly III-V compounds of elements such as GaAs, AlAs, InAs and their alloys. The gallium arsenide of a preferred embodiment is responsive to radiation in the range of frequencies from the infrared into the visible spectrum. The incident radiation is indicated in FIG. 2 by large arrow 32 for incoming light, and a smaller arrow 34 representing light which has entered into the body 12 and has become attenuated therein. The light of arrow 34 is attenuated exponentially with distance into the body 12, and may be regarded, for practical considerations, as been fully attenuated at a penetration depth indicated by a dashed line 36. The penetration depth is approximately two to three times the reciprocal of the extinction coefficient in a mathematical representation of the attenuation of the light.

The construction of the photodetector 10 continues by constructing the upper layer 14 upon the lower layer 16. Layer 14 is in the embodiment depicted in FIG. 2, a heterojunction layer which has a characteristically wider band gap than the underlying layer 16. For example, the lower layer 16 may be comprised of GaAs and the heterojunction layer 14 may be comprised of gallium-aluminum-arsenide (GaAlAs). In this case, the GaAlAs layer has a characteristic band gap which is wider than the underlying GaAs layer. The heterojunction layer 14 may also be comprised of indium-aluminum-arsenide (InAlAs) of greater band gap.

The lower layer 16 may, in other embodiments of the invention, be comprised of indium-gallium-arsenide and the layer 14 may be a non-latticed matched heterojunction comprised of GaAs or GaAlAs.

Figure 3:
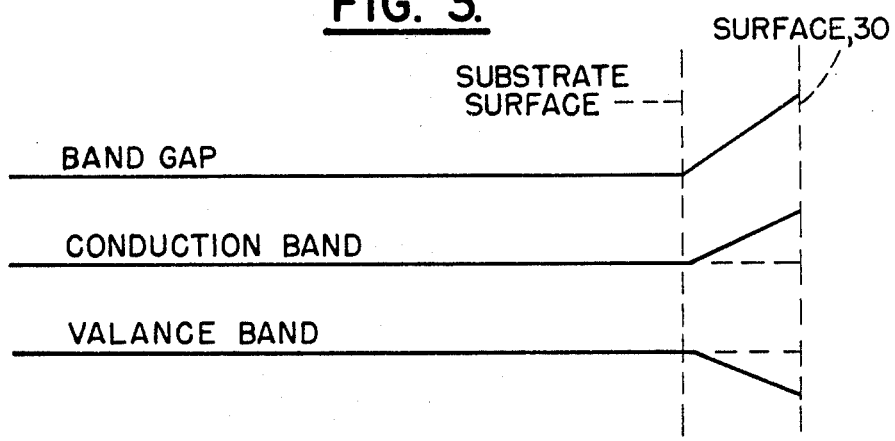
FIG. 3 shows an energy level diagram as a function of depth through the photodetector to illustrate the operation of the heterojunction layer of the photodetector.

A heterojunction is to be considered herein as a change in chemical properties from one side of an interface to another side of the interface. The heterojunction may be an abrupt heterojunction or a graded heterojunction. The effect of such a heterojunction layer is illustrated in FIG. 3 where it can be seen that the band gap is graded linearly from that of the substrate surface to that of the heterojunction layer band gap at the photodetector surface. Due to the band gap of the heterojunction upper layer 14, the bands near the surface are bent away from the positions they would have in the homojunction case, shown by the dotted line extensions.

As can be seen, the conduction band increases in energy while the valence band decreases in energy. The proportion to which the band gap of the surface layer is reapportioned between the conduction and valance bands is related in part to the relative electron affinities of the two semiconductors, that is, the electron affinities of the semiconductor material of the layer 16, and of the semiconductor material of the heterojunction, layer 14. In a typical IMSM photodetector in which the semiconductor material is nominally undoped, the aforementioned band bending results in the generation of electrical fields which act to repel both electrons and holes from the surface of the device, thereby beneficially reducing charge carrier trapping at the surface of the device.

In such heterojunction devices, such as the aforementioned GaAs/GaAlAs or InGaAs/GaAs devices, most of the difference in band gap energy is manifested in the conduction band with a lesser effect occurring in the valence band. This inequality between the conduction and valence bands results in the generation of a relatively large electric field for the repelling of electron from the surface and a smaller field for repelling holes. Thus, some small percentage of holes may be trapped at the surface.

Figure 4:
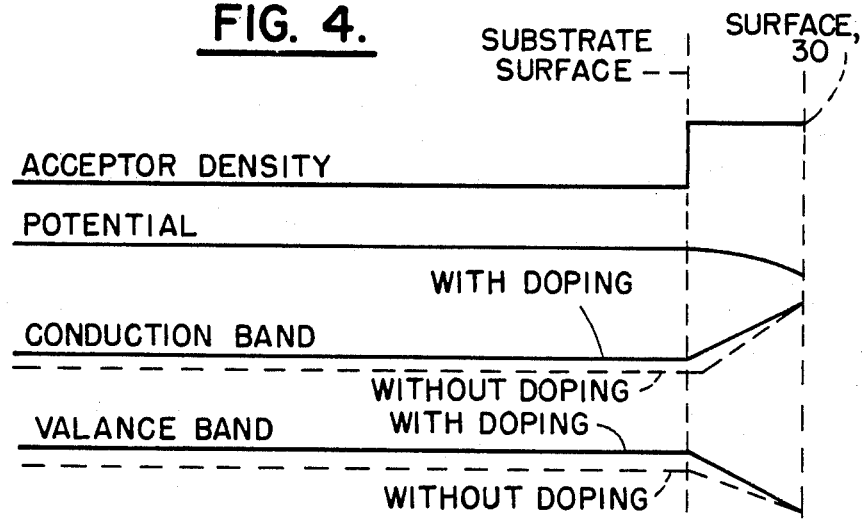
FIG. 4 shows an energy level diagram as a function of depth through the photodetector to illustrate the operation of the doped heterojunction layer of the photodetector.

To eliminate even this small amount of surface hole trapping the invention also provides for the doping of the heterojunction upper layer 14 with a p-type accepted impurity in order to increase the repulsion of holes from the surface. As shown in FIG. 4 the acceptor density may rise in a step-like manner within the heterojunction upper layer 14. The magnitude of the acceptor density is chosen such that the negative band bending of the valence band due to the doping is one half of the band bending due to the heterojunction. This addition of acceptor impurities results in the conductor band being bent up in energy by the same amount as the valence band is bent down, thereby generating an electrical field which repels from the surface both electrons and holes in substantially equal numbers.

In accordance with one member of the invention, a semi-insulating supporting substrate comprised of, for example, gallium arsenide has a layer of undoped gallium arsenide grown thereon. This undoped gallium arsenide layer is the bottom layer 16 of FIG. 2, and is the photoreceptive region of the photodetector 10. Over this layer 16 is then grown by, for example, metalorganic chemical vapor deposition (MOCVD) or molecular beam epitaxy (MBE) the heterojunction upper layer 4. This heterojunction upper layer 14 may be comprised of, as has been previously stated, GaAlAs. The upper layer 14 may then be doped with an acceptor impurity by, for example, the ionic implantation of a suitable dopant material. Beryllium may be employed as a p-type acceptor dopant. Magnesium can also be used as a dopant.

With respect to the physical dimensions of the structure of the photodetector 10, it should be noted that the portrayal of the electrode elements 28 is exaggerated in the height thereof so as to facilitate illustration of the elements 28. A typical value of height (FIG. 2) of the elements 28 is 0.15 micron. A typical value of width of an element 28 is 1.0 micron. A typical value of spacing between edges of successive ones of the elements 28 is 2.0 microns. The upper heterojunction layer 14 has a typical depth of 500 angstroms. The penetration depth indicated by the spacing between the top surface 30 and the line 36 is typically 2.0 microns in the case of infrared radiation incident upon gallium arsenide, this being the case depicted in FIG. 2.

Figure 5:
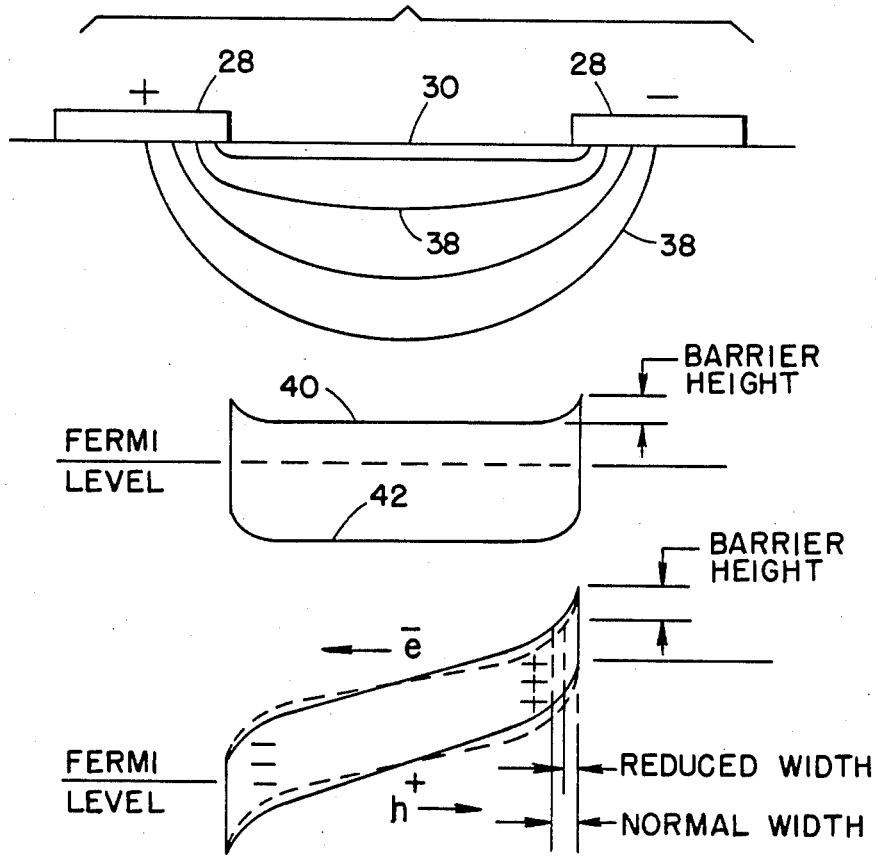
FIG. 5 shows an energy level diagram and a potential contour diagram as a function of depth through the photodetector to illustrate operation of the charge repulsion heterojunction layer of the photodetector.

The operation of the photodetector 10 can be explained with reference to the diagram shown in FIGS. 5 and 6. In FIG. 5, the upper diagram shows two successive ones of the electrode elements 28 located on the surface 30, the view herein corresponding to that of the sectional view of FIG. 2. The upper diagram of FIG. 5 also shows lines 38 of force representing the electric field joining the elements 28 in response to the imposition of a bias voltage by the battery 22. In particular, it is noted that the lines 38 tend to cluster together near the edges of the elements 28, and to spread apart at further distance from the element 28. The clustering together of the lines 38 near the edges of the elements 28, in combination with the subsequent spreading of the lines 38 at distance from the elements 28, indicate a potential gradient and its associated high electric field strength in the vicinity of the edges of the elements 28. Such a field strength pattern, in the absence of the doped heterojunction upper layer 14 of the invention, would induce a significant amount of surface entrapment of charge carriers of the electric current flowing between the electrode elements 28 in the presence of the incident radiation and upon imposition of the voltage of the battery 22. The entrapment of the charge carriers at the surface 30 rather than in the bulk of the material of the body 12 is particularly noticeable in the case of crystalline semiconductor material formed with high purity in which case there is little entrapment in the bulk material with the major portion of the entrapment occurring at the surface 30.

There is an energy band diagram corresponding to each of the lines 38 of force of the electric field. One such diagram is shown in the middle of FIG. 5, the diagram showing energy in the vertical direction and distance along a line 38 in the horizontal direction. By way of example, the energy level diagram in the middle of FIG. 5 is shown in registration with the inner edges of the elements 28 to correspond with the uppermost one of the lines 38, shown at the top of FIG. 5. This energy level diagram corresponds to the situation wherein the value of bias voltage is zero. Herein, the energy level diagram is symmetric with respect to each of the electrode elements 28. In particular, it is noted that there is a barrier having a height, as indicated in FIG. 5, this barrier being the potential barrier provided by a Schottky contact. In the construction of the photodetector 10, the electrodes 18 are formed on the surface 30 in accordance with well-known technology for forming a Schottky barrier between each of the elements 28 and the semiconductor material at the surface 30. Such construction corresponds to the energy diagram illustrated in the middle of FIG. 5. In particular, it is noted that the upper line 40 represents the bottom of a conduction band for electrons. The lower line 42 represents the upper edge of a valence band for holes. The Fermi level lies between the conduction and the valence bands.

The lower graph of FIG. 5 is the energy level diagram for the upper electric-field line 38 in the case wherein the battery 22 is applying a non-zero value of bias voltage. The electrode element 28 (top diagram) on the left side is understood to be provided with a positive potential relative to the electrode element 28 on the right side of FIG. 5, this being indicated by the plus and the minus signs. The bottom diagram of FIG. 3 is shown in two forms, one form being represented by a dashed line and the second form being represented by a solid line. The solid line indicates the energy level diagram which is present in the absence of entrapment of electric charge carriers at the surface 30, this being the energy level diagram present in the operation of the invention. The dashed line shows the effect on the energy level diagram produced by entrapment of the charge carriers, which effect would occur in the construction of a photodetector without implementation of the invention.

The solid trace shows a Schottky barrier with normal width, this width being sufficient to insure that no tunneling takes place. The dashed trace provides the Schottky barrier with a reduced width, which width allows a significant amount of tunneling to take place. Holes, indicated by the letter h and the plus signs migrate towards the right where the potential is more negative, and negative charges, indicated by the letter e and minus signs, migrate towards the left where the potential is more positive. Trapped holes, indicated by the positive signs, are shown towards the right of the energy diagram while trapped electrons, indicated by the minus signs, are shown at the left side of the energy diagram. It is the set of trapped charges which alter the shape of the solid trace to provide the undesired dashed trace with its attendant reduced with at the ends of the energy diagram.

The aforementioned band bending in the heterojunction upper layer 14, in conjunction with the p-type doping, provides a repulsive force which deflects the charge carriers away from the surface 30 so as to inhibit the entrapment of the charge carriers. Thereby, the holes and the electrons do not collect at the ends of the energy diagram, and the dashed representation of the energy diagram does not appear. Thus, in accordance with the invention, the charge repulsion feature of the upper layer 14 insures that the energy diagram has the shape of the solid trace with its associated normal width to the Schottky barrier. As noted above, the normal width is sufficient to insure no more than an insignificant amount of tunneling through the barrier.

In a preferred embodiment of the invention, sufficient charge repulsion has been attained by doping the heterojunction upper layer 14 with dopant at a concentration of $6 \times 10^{16}$ atoms/cubic centimeter. Such a concentration of dopant atoms in a layer on the order of a few microns thick, or thicker, would produce a highly conductive layer. However, in the relatively thin depth of the upper layer 14, 500 angstroms or less as noted above, the conductivity of the upper layer 14 still remains relatively low, sufficiently low so as to present no significant contribution to the current flow between electrode elements 28. It is interesting to note that, in the event that the upper layer 14 were extended to a greater depth, then the conduction band would approach the Fermi level as is the case in highly conductive material. However, due to the relatively small depth of the upper layer 14, the conduction band remains distant from the Fermi level, in spite of the high concentration of dopant atoms, so as to retain sufficient resistance between the anode electrode 18A and the cathode electrode 18B for proper operation of the photodetector 10. By way of example, in view of the high resistance of a layer of intrinsic, or semi-insulating, semiconductor material, as in the lower layer 16, which resistance might be on the order of many (10 to 40) megohm, a resistance of the upper layer 14 on the order of 0.1 megohm or 1.0 megohm would be adequate resistance for proper operation of the photodetector 10. This is attained with the above-noted depth of 500 angstroms of the upper layer 14.

The foregoing discussion applies to a structure of the electrodes 18 containing any number of the electrode elements 28. The dashed lines appearing in FIG. 2 indicate that the electrode structure may be extended to insert as many electrode elements 28 as may be required. Also the number of electrode elements 28 may be reduced. In the limiting case of only two electrode elements 28, one for the anode electrode 18A and one for the cathode electrode 18B, the foregoing theory of operation still applies.

The structure of the photodetector 10 is readily constructed on a supporting substrate (not shown) which might also support other semiconductor devices in the form of an integrated circuit, such devices including a field-effect transistor such as a GaAs MESFET. For example, such transistors may be constructed of layers of semiconductor material with implantation of dopants in specific regions. The processes employed in the construction of such devices may also employed in the construction of the invention. In particular, it is noted that steps of implantation, such as ionic implantation, are followed by a step of annealing to refurbish the crystalline structure so as to seat the implanted atoms in their proper sites in the crystalline lattice. While such annealing may tend to increase the tendency for surface entrapment of charged carriers, the thin charge repulsion layer of the invention adequately inhibits such entrapment. Thus, the invention is compatible with the implant annealing step.

As is well known, such interdigitated Schottky barrier detectors may be very useful in fiber optic communications applications due to the detector's low capacitance and the ease of integration with electronic circuitry. The low value of internal capacitance in conjunction with low values of parasitic capacitances associated with these devices make possible, when integrated on the same chip with preamplifier electronics, a highly sensitive and high speed receiver. The use of GaAs as the photodetector material limits the wavelength which can be efficiently detected to approximately 0.8 microns. However, the use of longer wavelength optical signals is often desirable due to the lower dispersion of longer wavelength radiation within a transmitting optical fiber. The use of longer wavelength optical signals also provides for the higher reliability of the radiation source, such as a laser or a laser diode. Photoreceptive structures which have a band gap sufficiently small to make possible such long wavelength radiation detection, however, are typically lattice mismatched to the underlying semiconductors such as the semiconductors employed in such well developed and characterized integration technologies such as silicon and GaAs.

For example, it is known that indium gallium arsenic phosphide (InGaAsP) is an efficient photoreceptor of wavelengths greater than 0.8 microns. However, this compound is lattice mismatched with silicon and GaAs, thereby requiring, typically, an indium phosphide substrate. Such a substrate is not currently well characterized for semiconductor integration, thereby limiting the usefulness of InGaAsP for longer wavelength detectors.

It is also known that InGaAs is an efficient photoreceptor at longer wavelengths, such as at a wavelength of 1.3 microns. However, InGaAs is also lattice mismatched with both silicon and GaAs substrates.

This problem is overcome by a second embodiment of the invention wherein an InGaAs photodetecting layer is utilized with a GaAs or silicon substrate and wherein the use of a higher band gap heterojunction layer forms a relatively large barrier metal-semiconductor Schottky barrier contact which produces an electrical field which substantially prevents the trapping of photo-generated electrons and holes at the surface of the photodetector device. In conjunction with the heterojunction, the accommodation of the lattice mismatch between InGaAs and GaAs is accomplished by misfit dislocations which are buried below the photoactive region of the InGaAs detector.

Referring to FIGS. 6 and 7 there is shown a representative photodetector 50 constructed in accordance with this embodiment of the invention. The plan view of FIG. 6 is similar to that of FIG. 1, however, only a portion of the interdigitated electrodes 54A and 54B are shown. Also, the resistor 20, battery 22, difference amplifier 24 are not shown, it being realized, however, that these other components are also present in the photodetector 50 of FIG. 6. A body 52 of semiconductor material is shown to be comprised of a plurality of layers. As seen in FIG. 7, a semi-insulating supporting substrate 58, which may be comprised of GaAs, has formed thereon an undoped GaAs buffer layer 60. Over buffer layer 60 is thereafter formed a lattice accommodation layer 61 which comprises, in sequence, a plurality of abrupt heterojunction layers 62, 64 and 66, each of these abrupt heterojunction layers being characterized as having a differing mole percent composition of InAs. For example, in the embodiment shown in FIGS. 6 and 7 layer 62 has a composition of 20 mole percent InAs. Layer 64 has a composition of 35 mole percent InAs and layer 66 has a composition of 40 mole percent InAs. Formed over these abrupt heterojunction layers 62-64 is a photoreceptive layer 68 which is also comprised of GaInAs, this layer being a pseudo-morphic layer which is graded back to GaAs at the surface 72. This graded back region of GaAs is shown by the dotted line 70, the region of GaAs being that portion of the layer 68 between the dotted line 70 and the surface 72. This graded back region of GaAs forms, in accordance with the invention, a heterojunction layer 71 overlying the GasInAs photodetecting layer 68. The mole percent of InAs within the photodetecting layer 68 is determined by the wavelength of radiation which is desired to be detected within this layer. For example, it is known that by varying the mole percent of InAs that the band gap of the material may be varied within a range of 1.4 electron volts to 0.3 electron volts, 0.3 electron volts corresponding to pure InAs. Thus, the varying mole percents of the layers 62-64 can be seen to be incrementally increased as the surface 72 is approached. In the example given the layer 66 has a 40 mole percent of InAs. The pseudo-morphic photodetecting layer 68 would then have, typically, a mole percent in excess of 40 mole percent InAs.

In other embodiments of the invention the photodetecting layer 68 may be comprised of gallium arsenide which is graded back to gallium-aluminum-arsenide to form the heterojunction layer 71.

Thus, it can be appreciated that the pseudo-morphoric layer 68 is slightly strained in that the in-plane lattice constant of layer 68 varies by a relatively small increment from the underlying layer 66 as compared to the relatively large increment which would result if the GaInAs layer 68 were grown directly on the GaAs buffer layer 60 or on GaAs substrate 58. As can be appreciated, the interposition of these abrupt heterojunction layer 62-64 enables the photodetector 50 to employ the relatively long wavelength absorption characteristics of GaInAs upon a GaAs or silicon substrate without the disadvantages created by the extreme lattice mismatch between the two types of semiconductor material. In general, it has been found that a change of from approximately 1.5 to 2 percent in lattice constant per accommodation layer is sufficient to accommodate the radiation absorbing layer to the substrate.

Furthermore, it can be realized that inasmuch as the photoreceptive area is substantially contained within the pseudo-morphic GaInAs layer 68, that the intervening misfit dislocations of the intervening abrupt heterojunction layers are buried below the photo-active region of the InGaAs detector. It can further be seen that inasmuch as the GaInAs layer 68 is graded back to GaAs in the layer 71, the resulting heterojunction layer 71 provides, as has been previously described, the beneficial effects of a large barrier metal-semiconductor Schottky barrier contact which produces an electrical field which substantially prevents the trapping of photo-generated electrons and holes at the surface. A further result is a substantial decrease in the dark current of the device and an overall increase in the signal-to-noise ratio.

If desired, the GaAs layer 71 at the surface 72 of the photodetector 50 may also be doped with a p-type acceptor impurity as has been previously described, to substantially equalize the band gap energies of the conduction and valence bands within the heterojunction, thereby substantially eliminating both trapped electrons and trapped holes. Also, layer 71 could be GaAlAs, which is lattice mismatched, or InAlAs, whose composition is lattice matched, to layer 68.

The construction of a photodetector in accordance with the embodiment of the invention depicted in FIGS. 6 and 7 more or less than three such abrupt heterojunction layers may be employed. For example, a photodetecting device may be provided with only two such abrupt heterojunction layers interposed between the GaAs buffer layer and the pseudo-morphic detector layer. In such a device, the abrupt heterojunction nearest the buffer layer may be provided with 30 mole percent InAs while the layer adjacent to the pseudo-morphic layer may be provided with a composition of 40 mole percent InAs. In general, the number of layers and the mole percent of InAs within each layer is determined in part by the desired mole percent InAs within the pseudo-morphic detector layer.

In accordance with a method of the invention for fabricating a 1.3 micron GaInAs photodetector as illustrated in FIG. 7, the following steps are performed. The undoped GaAs buffer layer 60 is grown on a semi-insulating substrate comprised of, for example, GaAs. Upon this layer is grown a 1 micron thick GaInAs abrupt heterojunction layer 62 having a composition of 20 mole percent InAs. Next is grown a 1 micron thick GaInAs layer 64 having a composition of 35 mole percent of InAs. Next is grown a 1 micron thick GaInAs layer 66 having a composition of 40 mole percent InAs. Over this layer 66 is grown a 1 micron thick pseudo-morphic layer of GaInAs the topmost 500 angstroms of which is graded back to GaAs at the surface 72. Upon the GaAs surface is fabricated a pattern of interdigitated metal electrodes 54A, 54B and 56 which form a Schotty barrier contact to the GaAs at the surface. The method of fabrication of the interdigitated metal electrodes 54A, 54B and 56 and the electrical characteristics of these electrodes in relation to the underlying GaAs substrate has been previously described.

The grading of the photodetecting layer may be accomplished in a well known manner by altering the composition of the elemental sources utilized by the growth apparatus, such as an MOCVD apparatus, during the growth of the photodetecting layer 68. For example, by gradually reducing the amount of indium compounds which enter the MOCVD growth chamber the composition of the layer will gradually be graded back to GaAs. Abrupt alteration of source elements may be utilized to vary the mole percent composition of InAs in the layers 62-66. Similar adjustments may be made to elemental sources in a MBE apparatus to achieve similar results.

As has been stated, if desired the GaAs heterojunction layer 71 may be doped, prior to the fabrication of the interdigitated metal electrodes, with a p-type acceptor impurity to equalize the band shift between the conduction and the valence bands. The dopant may be implanted therein.

Referring now to FIGS. 8 and 9 there is shown representative waveforms obtained from a detector fabricated in accordance with the method described above. FIG. 8 shows a pulse response of the detector corresponding to a band width of 4 GHz using an optical signal generated by a 0.82 micron wavelength GaAs laser. FIG. 9 shows the response to a lower frequency square wave signal at 1.3 microns. In FIG. 9 the lack of a positive signal excursion on the trailing edge of the square wave is indicative of the elimination of the undesirable low frequency gain which is frequently observed in many GaAs photodetectors.

It is to be understood that the above described embodiments of the invention are illustrative only, and that modifications thereof may occur to those skilled in the art. Accordingly, this invention is not to be regarded as limited to the embodiments disclosed herein, but is to be limited only as defined by the appended claims.

What is claimed is:

1. A semiconductor photoconductive device comprising:
   means including a substantially undoped first layer of semiconducting material for converting radiation incident upon the photoconductive device into electric charge carriers within said layer, said semiconducting material having a characteristic lattice constant and a characteristic energy band gap;
   a first electrode having an electrically conductive element extending upon a surface of said photoconductive device;
   a second electrode having an electrically conductive element extending upon said surface of said photoconductive device alongside of said element of said first electrode and spaced apart therefrom;
   each of said elements forming a Schottky barrier with said first semiconductor layer for development of an electric current in the presence of incident radiation and upon connection of a source of bias voltage between said first and said second electrodes, said photoconductive device further comprising:
   means including a second layer of semiconducting material having a characteristic lattice constant which is lattice mismatched to the lattice constant characteristic of the first layer and a characteristic energy band gap which is wider than the characteristic energy band gap of the first layer, said second layer being interposed between the surface of said photoconductive device and said first layer for deflecting both electrons and holes away from said surface, thereby to reduce entrapment of both electrons and holes along said surface and inhibit tunneling of both electrons and holes under a Schottky barrier.

2. A photoconductive device according to claim 1 wherein said first electrode comprises further electrically conductive elements, said element and said further elements of said first electrode constituting a first plurality of elements; and wherein said second electrode comprises further electrically conductive elements, said element and said further elements of said second electrode constituting a second plurality of elements, said first plurality of elements being interleaved among said second plurality of elements and being spaced apart therefrom to form an interdigitated electrode structure.

3. A photoconductive device according to claim 1 wherein the wider band gap of said second layer generates an electrical field which deflects both electrons and holes away from said surface.

4. A photoconductive device according to claim 3 wherein said second layer is doped to further deflect holes away from said surface.

5. A photoconductive device according to claim 4 wherein, in said first layer, said radiation penetrates to a predetermined penetration depth from said surface for defining an active region for said converting; and wherein the depth of said second layer is smaller by at least approximately an order of magnitude than the depth of said active region.

6. A photoconductive device according to claim 5 wherein the material of said first layer is semi-insulating semiconductor material having a characteristic resistivity, the resistance of the active region depending on the depth and resistivity of said active region; the doping of said second layer reducing the resistivity thereof to a value less than the resistivity of said first layer, the resistance of said second layer depending on the depth and resistivity of said second layer, the resistance of said second layer being greater than approximately one percent of the resistance of said active region.

7. A photoconductive device according to claim 6 wherein said first electrode comprises further electrically conductive elements, said element and said further elements of said first electrode constituting a first plurality of elements; and wherein said second electrode comprises further electrically conductive elements, said element and said further elements of said second electrode constituting a second plurality of elements, said first plurality of elements being interleaved among said second plurality of elements and being spaced apart therefrom to form an interdigitated electrode structure.

8. A photoconductive device according to claim 6 wherein the resistance of said second layer is greater than approximately one tenth of the resistance of said active region.

9. A photoconductive device according to claim 3 wherein each of said electrodes is formed of electrically conductive material, wherein the semiconductor material of said first layer is comprised of semi-insulating gallium-arsenide, and wherein the second layer is comprised of indium-aluminum-arsenide of greater band gap than said first layer.

10. A photoconductive device according to claim 3 and further comprising an underlying supporting substrate of semiconductor material having a characteristic lattice constant.

11. A photoconductive device according to claim 10 wherein said first layer is latticed mismatched to said substrate and wherein said photoconductive device further comprises:
means for substantially accommodating the lattice constant of said first layer to the lattice constant of said substrate.

12. A photoconductive device according to claim 11 wherein said accommodating means includes at least a third layer of semiconductor material having a lattice constant which is greater than the lattice constant of said substrate and which is less than the lattice constant of said first layer such that said third layer is lattice mismatched to said substrate and also to said first layer.

13. A photoconductive device according to claim 12 wherein said first layer is comprised of GaInAs and wherein said substrate is comprised of GaAs.

14. A photoconductive device according to claim 12 wherein said first layer is comprised of GaInAs and wherein said substrate is comprised of Si.

15. A photoconductive device according to claim 12 wherein said first layer is comprised of GaInAs and wherein said second layer is comprised of GaAs.

16. A photoconductive device according to claim 13 wherein said first layer is comprised of GaInAs having a predetermined mole percentage of InAs and wherein said third layer of semiconductor material is comprised of GaInAs having a mole percentage of InAs which is less than the mole percentage of InAs of said first layer.

17. In a radiation responsive photoconductive device comprising a Schottky barrier rectifying metal contact on a semiconductor surface, the improvement comprising a heterojunction region in said surface adjacent to said metal contact, said region being of sufficient thickness to prevent tunneling of photogenerated carriers to a noncontacted region of the surface of the heterojunction region and to also permit efficient repulsion of both electrons and holes from the surface, said heterojunction region having a wider band gap than an underlying substantially undoped radiation absorbing semiconductor region to deflect substantially all electrons and holes away from said surface, said heterojunction region being lattice mismatched to said underlying radiation absorbing region.

18. A semiconductor photoconductive device comprising:
means including a substantially undoped first layer of semiconducting material for converting radiation incident upon the photodetector into electric charge carriers within said layer, said semiconducting material having a characteristic lattice constant and a characteristic energy band gap;
a first electrode having an electrically conductive element extending upon a surface of said photodetector;
a second electrode having an electrically conductive element extending upon said surface of said photodetector alongside of said element of said first electrode and spaced apart therefrom;
each of said elements forming a Schottky barrier with said first semiconductor layer for development of an electric current in the presence of incident radiation and upon connection of a source of bias voltage between said first and said second electrodes, said photodetector further comprising:
means including a second layer of semiconducting material having a characteristic lattice constant which is substantially lattice matched to the lattice constant characteristic of the first layer and a characteristic energy band gap which is wider than the characteristic energy band gap of the first layer, said second layer being interposed between the surface of said photodetector and said first layer for deflecting both electrons and holes away from said surface, thereby to reduce entrapment of both electrons and holes along said surface and inhibit tunneling of both electrons and holes under a Schottky barrier.

19. A photoconductive device according to claim 18 wherein said first electrode comprises further electrically conductive elements, said element and said further elements of said first electrode constituting a first plurality of elements; and wherein said second electrode comprises further electrically conductive elements, said element and said further elements of said second electrode constituting a second plurality of elements, said first plurality of elements being interleaved among said second plurality of elements and being spaced apart therefrom to form an interdigitated electrode structure.

20. A photoconductive device according to claim 18 wherein the wider band gap of said second layer generates an electrical field which deflects both electrons and holes away from said surface.

21. A photoconductive device according to claim 20 wherein said second layer is doped to further deflect holes away from said surface.

22. A photoconductive device according to claim 21 wherein, in said first layer, said radiation penetrates to a predetermined penetration depth from said surface for defining an active region for said converting; and wherein the depth of said second layer is smaller by at least approximately an order of magnitude than the depth of said active region.

23. A photoconductive device according to claim 22 wherein the material of said first layer is semi-insulating semiconductor material having a characteristic resistivity, the resistance of the active region depending on the depth and resistivity of said active region; the doping of said second layer reducing the resistivity thereof to a value less than the resistivity of said first layer, the resistance of said second layer depending on the depth and resistivity of said second layer, the resistance of said second layer being greater than approximately one percent of the resistance of said active region.

24. A photoconductive device according to claim 23 wherein said first electrode comprises further electrically conductive elements, said element and said further elements of said first electrode constituting a first plurality of elements; and wherein said second electrode comprises further electrically conductive elements, said element and said further elements of said second electrode constituting a second plurality of elements, said first plurality of elements being interleaved among said second plurality of elements and being spaced apart therefrom to form an interdigitated electrode structure.

25. A photoconductive device according to claim 23 wherein the resistance of said second layer is greater than approximately one tenth of the resistance of said active region.

26. A photoconductive device according to claim 20 wherein each of said electrodes is formed of electrically conductive material, wherein the semiconductor material of said first layer is comprised of semi-insulating gallium-arsenide, and wherein the second layer is comprised of gallium-aluminum-arsenide.

27. A photoconductive device according to claim 20 and further comprising an underlying supporting substrate of semiconductor material having a characteristic lattice constant.

28. A photoconductive device according to claim 27 wherein said first layer is lattice mismatched to said substrate and wherein said photoconductive device further comprises:
means for substantially accommodating the lattice constant of said first layer to the lattice constant of said substrate.

29. A photoconductive device according to claim 28 wherein said accommodating means includes at least a third layer of semiconductor material having a lattice constant which is greater than the lattice constant of said substrate and which is less than the lattice constant of said first layer such that said third layer is lattice mismatched to said substrate and also to said first layer.

30. A photoconductive device according to claim 29 wherein said first layer is comprised of GaInAs and wherein said substrate is comprised of GaAs.

31. A photoconductive device according to claim 29 wherein said first layer is comprised of GaInAs and wherein said substrate is comprised of Si.

32. A photoconductive device according to claim 29 wherein said first layer is comprised of GaInAs and wherein said second layer is comprised of InAlAs having a lattice matched composition.

33. A photoconductive device according to claim 30 wherein said first layer is comprised of GaInAs having a predetermined mole percentage of InAs and wherein said third layer of semiconductor material is comprised of GaInAs having a mole percentage of InAs which is less than the mole percentage of InAs of said first layer.

34. In a radiation responsive photoconductive device comprising a Schottky barrier rectifying metal contact on a semiconductor surface, the improvement comprising a heterojunction region in said surface adjacent to said metal contact, said region being of sufficient thickness to prevent tunneling of photogenerated carriers to a noncontacted region of the surface of the heterojunction region and to also permit efficient repulsion of both electrons and holes from the surface, said heterojunction region having a wider band gap than an underlying substantially undoped radiation absorbing semiconductor region to deflect substantially all electrons and holes away from said surface, said heterojunction region being substantially lattice matched to said underlying radiation absorbing region.

35. A photoconductive device according to claim 12 wherein said first layer is comprised of GaInAs and wherein said second layer is comprised of GaAlAs.

36. A photoconductive device comprising a pair of interdigitated electrically conductive electrodes which are disposed upon a surface of the device, the electrodes forming a Schottky contact with an underlying radiation absorbing region, the radiation absorbing region being comprised of material having a composition of $Ga_xIn_{(1-x)}As$ and having a band gap responsive to radiation of a predetermined wavelength for generating electron-hole pairs therefrom, the radiation absorbing region including a heterojunction region interposed between said radiation absorbing region and the surface, said heterojunction region having a wider band gap than said radiation absorbing region for repelling both electrons and holes from the surface, said heterojunction region having a composition at the surface which differs from that of the composition of the radiation absorbing region.

37. A photoconductive device as defined in claim 36 wherein x is approximately 0.4 to approximately 0.6 and wherein the heterojunction region is comprised at the surface of material having the composition GaAs.

38. A photoconductive device as defined in claim 36 wherein x is approximately 0.4 to approximately 0.6 and wherein the heterojunction region is comprised at the surface of material having the composition $Ga_{0.8}Al_{0.2}As$.

39. A photoconductive device as defined in claim 36 wherein x is approximately 0.4 to approximately 0.6 and wherein the heterojunction region is comprised at the surface of material having the composition $Al_yIn_{(1-y)}As$ wherein y is substantially equal to the value of x.

40. A photoconductive device as defined in claim 36 wherein the heterojunction region has a thickness of approximately 500 angstoms.

41. A photoconductive device as defined in claim 36 and further comprising a substrate which is comprised of GaAs.

42. A photoconductive device as defined in claim 41 and further comprising at least one lattice accommodation layer interposed between said substrate and said radiation absorbing region, said at least one lattice accommodation layer comprising GaInAs hving a composition which is lattice mismatched to both said substrate and to said radiation absorbing region.

43. A photoconductive devices as defined in claim 36 wherein said heterojunction region is compositionally graded from the composition of the radiation absorbing region to a different composition at the surface.

44. A photoconductive device as defined in claim 36 wherein said predetermined wavelength is approximately 1.3 microns.

45. A photoconductive device as defined in claim 36 wherein said predetermined wavelength is approximately 1.5 microns.

* * * * *